United States Patent
Cayabyab et al.

(10) Patent No.: US 10,615,075 B2
(45) Date of Patent: Apr. 7, 2020

(54) DICING A WAFER

(71) Applicant: TEXAS INSTRUMENTS INCORPORATED, Dallas, TX (US)

(72) Inventors: Jerry Gomez Cayabyab, Baguio (PH); Jeniffer Otero Aspuria, Baguio (PH); Julian Carlo Concepc Barbadillo, Pampanga (PH); Alvin Lopez Andaya, Pangasinan (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/007,623

(22) Filed: Jun. 13, 2018

(65) Prior Publication Data

US 2019/0385911 A1    Dec. 19, 2019

(51) Int. Cl.
| | | |
|---|---|---|
| *H01L 21/78* | (2006.01) | |
| *H01L 21/687* | (2006.01) | |
| *H01L 21/268* | (2006.01) | |
| *H01L 21/683* | (2006.01) | |

(52) U.S. Cl.
CPC .......... *H01L 21/78* (2013.01); *H01L 21/2686* (2013.01); *H01L 21/6836* (2013.01); *H01L 21/68785* (2013.01)

(58) Field of Classification Search
CPC .............. H01L 21/78; H01L 21/6836; H01L 21/68785; H01L 21/2686
See application file for complete search history.

(56) References Cited

U.S. PATENT DOCUMENTS

| | | | |
|---|---|---|---|
| 5,718,615 A | 2/1998 | Boucher et al. | |
| 6,297,131 B1 * | 10/2001 | Yamada | H01L 21/6835 |
| | | | 257/E21.599 |
| 6,319,754 B1 | 11/2001 | Wang et al. | |
| 6,521,513 B1 * | 2/2003 | Lebens | B81C 1/00873 |
| | | | 257/620 |
| 7,294,559 B2 | 11/2007 | Hsu | |
| 8,975,162 B2 | 3/2015 | Lei et al. | |
| 8,999,816 B1 * | 4/2015 | Holden | H01L 21/78 |
| | | | 438/113 |
| 2004/0142284 A1 | 7/2004 | Sakaguchi et al. | |
| 2004/0219443 A1 | 11/2004 | Spears | |
| 2008/0260982 A1 * | 10/2008 | Senoo | H01L 21/6836 |
| | | | 428/40.1 |
| 2015/0206743 A1 * | 7/2015 | Ward | H01L 21/02381 |
| | | | 257/77 |

* cited by examiner

*Primary Examiner* — Edward Chin
(74) *Attorney, Agent, or Firm* — Ronald O. Neerings; Charles A. Brill; Frank D. Cimino

(57) ABSTRACT

A method for dicing a wafer includes scribing perforations in a wafer. The wafer has a monocrystalline structure and the perforations have a polycrystalline structure. The method also includes adhering the wafer to a top surface of a dicing tape and applying a downward force on a periphery of the dicing tape. The downward force causes a bottom surface of the dicing tape to deform around a contour of a dome-shaped chuck, breaking the perforations in the wafer.

20 Claims, 3 Drawing Sheets

DICING A WAFER

TECHNICAL FIELD

This disclosure relates to semiconductors, and more particularly, to dicing a wafer.

BACKGROUND

A wafer, also called a slice or substrate, refers to a thin slice of semiconductor material, such as silicon, used in electronics for the fabrication of integrated circuit (IC) chips and in photovoltaics for wafer-based solar cells. The wafer serves as the substrate for microelectronic devices built in and over the wafer and undergoes microfabrication process stages such as doping or ion implantation, etching, deposition of various materials and photolithographic patterning.

Wafer dicing (or simply dicing) is the process by which die are separated from a wafer of semiconductor following the processing of the wafer. The dicing process can involve scribing and breaking, mechanical sawing (normally with a machine called a dicing saw) or laser cutting. Methods for dicing are automated to ensure precision and accuracy. Following the dicing process the individual silicon chips are encapsulated into chip carriers which are then suitable for use in building electronic devices such as computers, etc.

During dicing, wafers are adhered to a dicing tape which has a sticky backing that holds the wafer on a thin sheet metal frame, which is sometimes referred to as a flex frame. Dicing tape has different properties depending on the dicing application. Once a wafer has been diced, the pieces left on the dicing tape are referred to as die, dice or dies. Each will be packaged in a suitable package or placed directly on a printed circuit board substrate as a "bare die". Once a wafer has been diced, the die will stay on the dicing tape until they are extracted by die-handling equipment, such as a die bonder or die sorter, further in the electronics assembly process.

SUMMARY

One example relates to a method for dicing a wafer that includes adhering a wafer to a top surface of a dicing tape. The method also includes scribing perforations in the wafer. The wafer has a monocrystalline structure and the perforations have a polycrystalline structure. The method also includes applying a downward force on a periphery of the dicing tape. The downward force causes a bottom surface of the dicing tape to deform around a contour of a dome-shaped chuck, breaking the perforations in the wafer.

Another example relates to a method for forming an IC chip. The method include adhering a wafer to dicing tape. The wafer includes a given die forming a discrete circuit and a plurality of perforations, wherein the given die is circumscribed by a set of the plurality of perforations of the wafer. The method also includes moving the dicing tape attached to a flex frame from a first position to a second position, wherein the dicing tape has a flat surface in the first position. The method further includes deforming the dicing tape along a contour of a dome-shaped region of a dome-shaped chuck in the second position. In the second position, the dome-shaped chuck induces forces transverse to the flat surface of the dicing tape in the first position that cause the plurality of perforations in the wafer to break. The method yet further includes packaging the given die of the plurality of dies in an IC chip.

Yet another example relates to a method for forming a plurality of integrated circuit (IC) chips. The method includes adhering the wafer that includes perforations between dies of the wafer to a dicing tape. A flex frame is attached to the dicing tape. The method also includes moving the dicing tape from a first position to a second position, wherein the dicing tape has a flat surface in the first position. The method further includes deforming the dicing tape along a contour of a dome-shaped region of a dome-shaped chuck in the second position. In the second position, the dome-shaped chuck induces forces transverse to the flat surface of the dicing tape in the first position that cause the perforations in the wafer to break. The method also include packaging the dies of the wafer in integrated circuit (IC) chips.

DETAILED DESCRIPTION

Examples of systems and techniques for dicing a wafer (e.g., a silicon wafer) are described. The wafer has perforations that divide dies of the wafer. In at least one example, the perforations are formed with a lasing process. Each die is implemented as a discrete circuit that is employable in an integrated circuit (IC) chip or other electronic device, such as a photovoltaic cell. The wafer is adhered to sticky backing of a dicing tape formed of an elastic material, and the dicing tape is affixed to a flex frame that is movable in a vertical direction. Moreover, the flex frame moves the dicing tape from a first position to a second position.

In the first position, the dicing tape has a flat (e.g., within a tolerance of about 1 millimeter) top and bottom surfaces. Similarly, the wafer initially has a flat surface (e.g., within a tolerance of about 1 millimeter) that overlays the top (flat) surface of the dicing tape. The flex frame applies a downward force to move the dicing tape to the second position and toward a domed region of a dome-shaped chuck. Continued application of the downward force deforms the dicing tape over a contour of the dome-shaped chuck. Accordingly, the dome-shaped chuck induces forces that are transverse to the flat surface of dicing tape, causing the perforations in the wafer to crack. More particularly, the dome-shaped chuck induces non-uniform lateral forces across a thickness of the wafer that causes the dies of the wafer to separate along the perforations. Dicing techniques that rely solely on an application of lateral forces, namely forces lateral to the flat surface of the dicing tape often fail to separate every die of a wafer. By employing the stealth dicing technique described herein, the forces transverse to the flat surface of the dicing tape and the wafer in the first position reduce the number of instances where the perforations fail to break.

Figure 1:
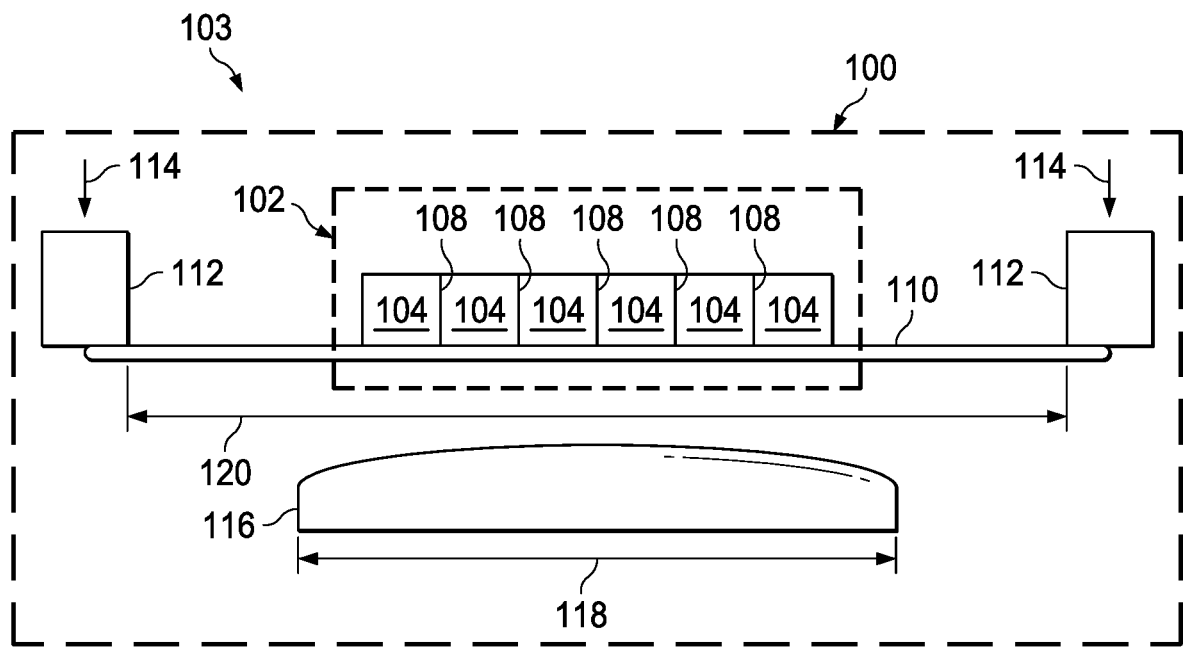
FIG. 1 illustrates a diagram of a system in a first stage of a dicing technique on a wafer.

FIG. 1 illustrates a diagram of an example system 100 for dicing (wafer dicing) a wafer 102 of semiconductor material that forms a plurality of discrete functional circuits. FIG. 1 illustrates a first stage 103 of the stealth dicing process. The wafer 102 has undergone a microfabrication process to form the plurality of functional circuits. Each such discrete circuit is formed on a region of the wafer 102 referred to as a die 104. The wafer 102 can be a silicon wafer with a flat surface (within a tolerance of about 1 millimeter). The dicing process is a stealth dicing process. As used herein, the term "stealth dicing" refers to a wafer dicing technique in which dies 104 of the wafer 102 are scribed with a laser dicing process. In the illustrated example, there are seven (7) dies 104 illustrated for the wafer 102, but in other examples, more dies 104 (e.g., hundreds or thousands) of dies 104 can be included on a single wafer.

In some examples, the wafer 102 has a monocrystalline structure. Moreover, by employing stealth dicing techniques (laser processing techniques) perforations 108 formed of polycrystalline structures are scribed into the wafer 102. The perforations 108 define boundaries of the dies 104.

The wafer 102 is adhered to a sticky surface of a dicing tape 110. The dicing tape 110 is a backing tape formed from elastic material used during dicing of the wafer 102. The dicing tape 110 holds the dies 104 together during the stealth dicing process. Additionally, the dicing tape 110 is affixed to a flex frame 112, which is implemented as a thin metal frame circumscribing the dicing tape 110 in at least one example. In some examples, the dicing tape 110 is formed of an elastic material, such as polyvinyl chloride (PVC), polyolefin or polyethylene backing material with an adhesive to hold the dies 104 in place. In some examples, the dicing tape 110 includes a release liner covering the a top surface (a sticky surface) of the dicing tape, and the release liner is removed prior to mounting the wafer 102 on the dicing tape 110. In some examples, the dicing tape 110 has a thicknesses, from 75 to 150 micrometers. In the first stage, a top side of the dicing tape 110 forms a flat surface (e.g., within a tolerance of about 1 millimeter). Additionally, a bottom side of the dicing tape 110 is also flat, and the bottom side opposes the top side of the dicing tape 110.

The flex frame 112 applies a downward force at a periphery of the dicing tape 110 in a direction indicated by the arrows 114. Application of the downward force 114 moves the dicing tape 110 and the wafer 102 mounted thereon toward a dome-shaped chuck 116. In some examples, the dome-shaped chuck 116 has a cylindrical shape with a dome region having a curved surface that faces the bottom surface of the dicing tape 110. In some examples, the dome-shaped chuck 116 has a diameter 118 that is greater than a largest diameter (e.g., diameter or width) of the wafer 102 and less than an inner diameter 120 of the flex frame 112, measured from edges of the flex frame 112 proximal to the wafer 102. That is, the dome-shaped chuck 116 is sized to extend beyond the edges of the wafer 102 and be positioned within inner edges of the flex frame 112.

Figure 2:
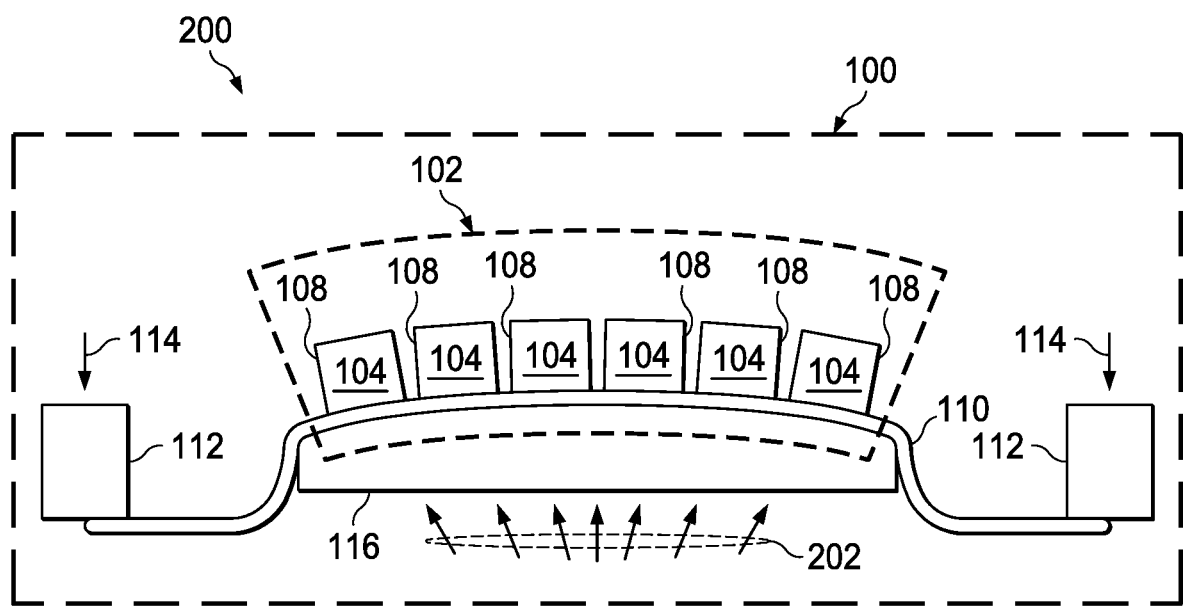
FIG. 2 illustrates a diagram of the system of FIG. 1 in a second stage of the dicing technique on a wafer.

Upon continued application of the downward force 114, the system 100 transitions from the first stage 103 illustrated in FIG. 1 to a second stage 200 illustrated in FIG. 2. For purposes of simplification of explanation, the same reference numbers are employed in FIGS. 1 and 2 to denote the same structure.

Application of the downward force 114 causes the dicing tape 110 to deform to the contour of the leading surface of the dome-shaped chuck 116, namely the dome region of the dome-shaped chuck 116. Additionally, application of the downward force 114 causes the dome-shaped chuck 116 to induce transverse forces indicated by arrows 202. The transverse forces 202 are forces that are transverse to the flat surfaces of the dicing tape 110 (the top and bottom surfaces of the dicing tape 110) and to the flat surface of the wafer 102 in the first stage 103 illustrated in FIG. 1. The transverse forces 202 cause the perforations 108 to break (crack and separate), thereby separating the die 104 from each other. In fact, rather than inducement of a uniform lateral force that is parallel to the planar surface of the dicing tape 110 and/or the wafer 102, the transverse forces 202 results in more lateral force to a top region of the dies 104 than to a bottom region. That is, the transverse forces 202 induce non-uniform lateral forces across a thickness of the wafer 102. Accordingly, the perforations 108 of the wafer 102 are broken apart (split apart), thereby separating the die 104 from each other. Upon separating the die 104 of the wafer 102, the flex frame 112 restores the dicing tape 110 to the first position.

Figure 3:
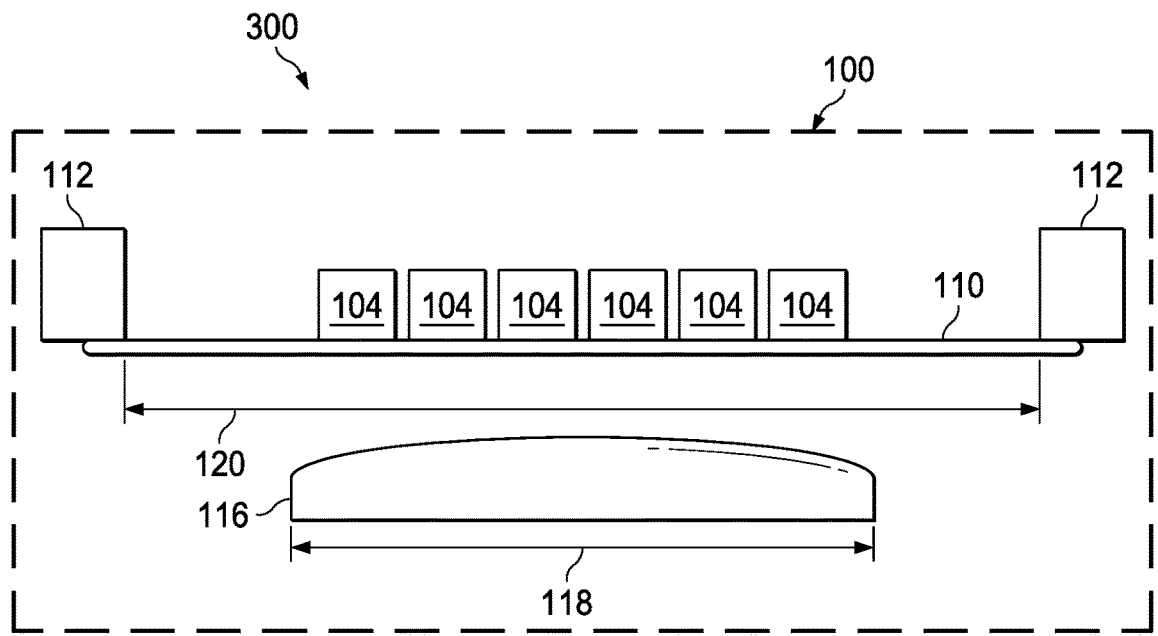
FIG. 3 illustrates a diagram of the system of FIG. 1 in a third stage of the dicing technique on a wafer.

FIG. 3 illustrates a third stage 300 for of the system 100. For purposes of simplification of explanation, the same reference numbers are employed in FIGS. 1-3 to denote the same structure. In the third stage 300 the downward force 114 of the second stage 200 (illustrated in FIGS. 1 and 2) has ceased. In some examples, the dicing tape 110 returns to a flat (e.g., within a tolerance of about 1 millimeter) surface. In other examples, the dicing tape 110 sags after expansion. Thus, in some examples, the flatness of the dicing tape 110 varies based on physical properties of the dicing tape 110 and on an amount of force applied on the dicing tape 110 during the transition from the first stage 100 to the second stage 200. Additionally, individual dies 104 are removable from the dicing tape 110 for further processing, such as but not limited to packaging in an IC chip enclosure.

By employing the system 100, the dicing techniques illustrated in FIGS. 1-3 elevates the probability that each die 104 separates with application of the downward force 114. For example, in comparison to a system that is limited to the application of lateral force to separate the dies, application of the transverse forces 202 reduces the die un-separation rate from about 500 defect parts per million (DPPM) to less than about five (5) DPPM.

Figure 4:
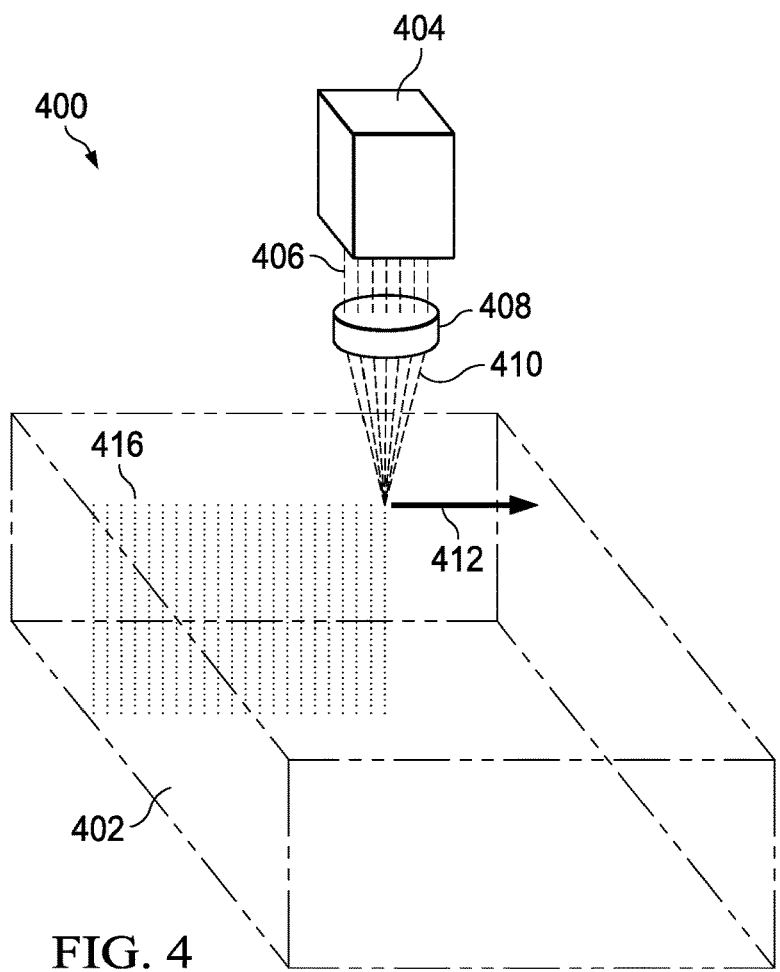
FIG. 4 illustrates a diagram of a system for laser processing a wafer.

FIG. 4 illustrates a system 400 for laser processing in a stealth dicing process of a wafer 402, such as the wafer 102 of FIGS. 1-3. That is, in at least one example, the laser processing executed by the system 400 is executed prior to the execution of the first stage 103 of the system 100 of FIG. 1. In some examples, the stealth dicing techniques can be applied to the wafer 402 after the wafer 402 has undergone backgrind processing to reduce a thickness of the wafer 402. In such a situation, the wafer 402 may still be adhered to a backgrind tape.

For purposes of simplification of explanation, the wafer 402 is illustrated as a rectangular prism. However, in other examples, other shapes are employable, including shapes such as polyhedrons, ovals and circles. Additionally, it is presumed that the wafer 402 is a silicon wafer with a monocrystalline structure.

The system 400 includes a laser 404 that provides a light beam 406 to a collimating lens 408. In at least one example, the light beam 406 has a wavelength of about 1064 nanometers (nm). The collimating lens 408 focuses the light beam 406 to form a focused beam 410 that is scribed to an interior region of the wafer 402. Stated differently, the focused beam 410 is focused on a region between a top and bottom surface of the wafer 402. The laser 404 and the collimating lens 408 are moveable in two-dimensions (2D) with respect to the surface of the wafer 402. That is, the laser 404 and the collimating lens 408 are moveable in horizontal and vertical axes of the wafer 402.

In the present example, the laser 404 moves in a direction indicated by an arrow 412. Application of the focused beam 410 forms mechanical damage via a heat-melt cycle to change the state from the monocrystalline structure of the wafer 402 to a perforation 416 with a polycrystalline structure. In some examples, the perforation 416 is referred to as a stealth dicing (SD) layer. In at least one example, the perforation 416 is representative of one of the perforations 108 illustrated in FIGS. 1-2.

The perforation 416 operates as a crack initiation region of the wafer 402. In this manner, die formed in the wafer 402 can be separated by employing the stealth dicing techniques illustrated in FIGS. 1-3. In some examples, the perforation 416 can have a width of about 2 micrometers ($\mu$m) to about 5 $\mu$m.

Figure 5:
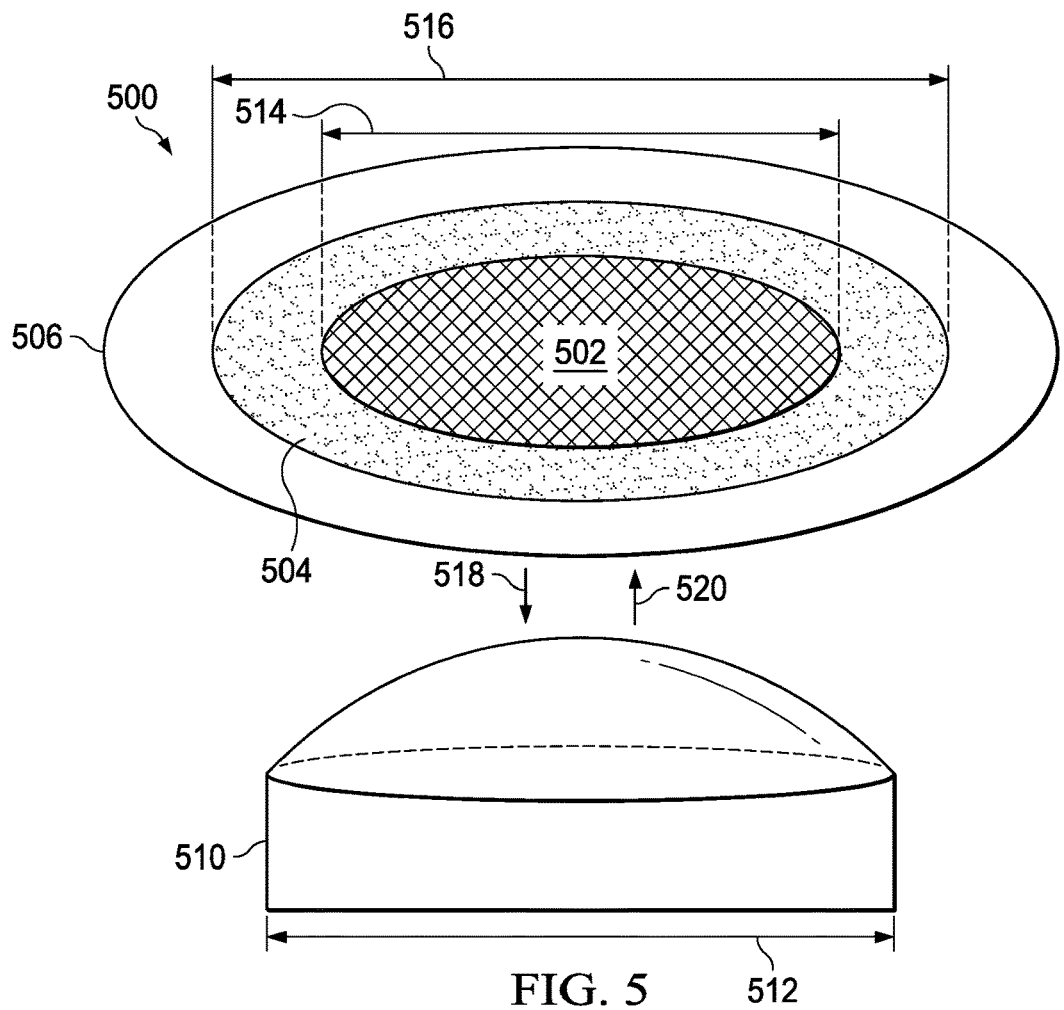
FIG. 5 illustrates another example of a system for implementing a dicing technique on a wafer.

FIG. 5 illustrates an example of a perspective view of a system 500 for implementing stealth dicing. In at least one example, the system 500 is representative of the system 100 illustrated in FIGS. 1-3.

The system 500 includes a wafer 502 that is adhered to a sticky surface of a dicing tape 504, namely a top surface of the dicing tape 504. In at least one example, the wafer 502 is employed to implement the wafer 102 of FIGS. 1-2, and the dicing tape 504 is employed to implement the dicing tape 110 of FIGS. 1-3. The dicing tape 504 is attached to a flex frame 506. In at least one example, the flex frame 506 is employed to implement the flex frame 112 of FIGS. 1-3.

In the example illustrated, the wafer 502 has undergone laser processing, such as the laser processing illustrated in FIG. 4. Accordingly, the wafer 502 includes perforations between dies of the wafer 502.

The flex frame 506 and the dicing tape 504 overlay a dome-shaped chuck 510. In at least one example, the dome-shaped chuck 510 is employed to implement the dome-shaped chuck 116 illustrated in FIGS. 1-3. Accordingly, dome-shaped chuck 510 has a cylindrical base with a dome-shaped region. In at least one example, the dome-shaped chuck 510 has a diameter 512 that is greater than a largest dimension 514 of the wafer 502 (e.g., the diameter of the wafer 502) and less than an inner diameter 516 of the flex frame 506.

The top surface and a bottom surface of the dicing tape 504 are flat (e.g., within a tolerance of about 1 mm), and the bottom surface overlies the dome-shaped chuck 510. Initially, the wafer 502 also has a flat surface (e.g., within a tolerance of about 1 millimeter), and the flat surface of the wafer 502 is adhered to the top surface of the dicing tape 504.

The flex frame 506 is moveable in the direction indicated by a down arrow 518 and an up arrow 520. Upon moving the flex frame 506 in the direction of the down arrow 518, a downward force is applied on a periphery of the dicing tape 504 that causes the bottom surface of the dicing tape 504 to contact the dome region of the dome-shaped chuck 510, which causes the dicing tape 504 to deform to the contour of the dome region of the dome-shaped chuck 510. The dome-shaped chuck 510 induces forces transverse to the top and bottom surfaces (referred to as transverse forces) of the dicing tape 504 and to the flat surface of the wafer 502, which causes perforations in the wafer 502 to break (crack), allowing die of the wafer 502 to separate. That is, the transverse forces induce non-uniform lateral forces across a thickness of the wafer 502 which cause the die of the wafer 502 to separate for subsequent processing such as packaging to form IC chips.

Figure 6:
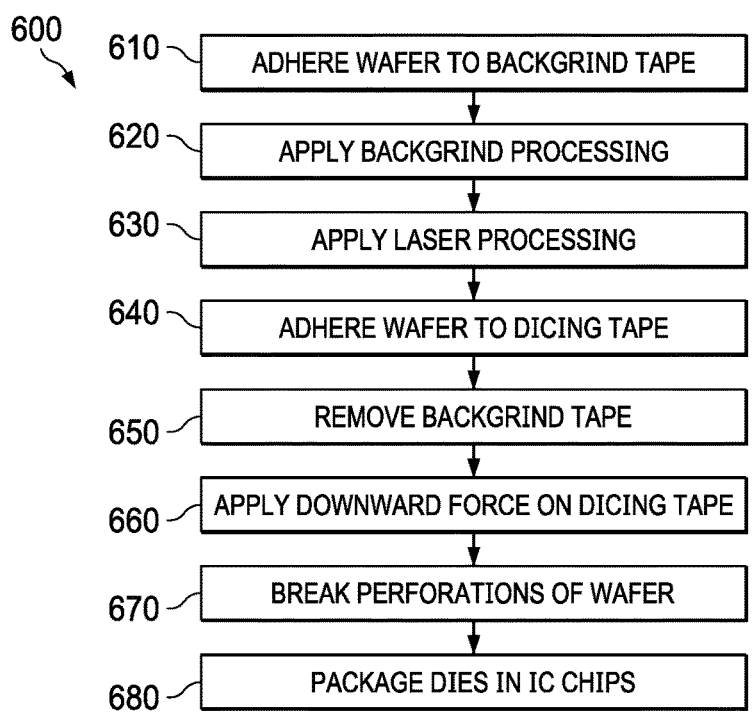
FIG. 6 illustrates a method for dicing a wafer.

FIG. 6 illustrates a method 600 for stealth dicing a wafer (e.g., a silicon wafer) for a monocrystalline structure. The method 600 could be implemented, for example, by the system 100 of FIGS. 1-3 and/or the system 400 of FIG. 4. At 610, the wafer is adhered to a backgrind tape formed of an elastic material. The wafer can be adhered to the backgrind tape on a first side of the wafer, which may be referred to as a circuit side of the wafer. At 620 a backgrind process is applied to a second side of the wafer, wherein the second side opposes the circuit side (first side) of the wafer and can be referred to as a backside of the wafer. The backgrind process reduces a thickness of the wafer to allow for stacking and/or high-density packaging. At 630, a lasing process is applied to the wafer to scribe perforations formed of a poly-crystalline structure. In at least one example, the scribing of the lasing process is executed with a laser that lases the wafer in two dimensions (two horizontal axes of the wafer).

At 640, the backside of the wafer (the second side) is adhered to a dicing tape. At 650, the backgrind tape is removed from the circuit side (the first side) of the wafer.

At 660, a flex frame attached to the dicing tape applies a downward force on a periphery of the dicing tape against a dome-shaped chuck. The downward force moves the dicing tape from a first position to a second position. In the first position, a top surface and a bottom surface of the dicing tape are flat (e.g., within a tolerance of about 1 millimeter), and the wafer is adhered to the top surface of the dicing tape. In the second position, the dicing tape is deformed around a contour of the dome-shaped chuck that underlies the bottom surface of the dicing tape. At 670, the dome-shaped chuck induces forces transverse to the flat surface of the dicing tape and the wafer in the first position, breaking the perforations in the wafer. Breaking the perforations causes the dies in the wafer to separate. At 680, the separated dies (or some subset thereof) are packaged in IC chips.

It is understood that in some examples, the actions of the method 600 could occur in a different order. For example, in some situations, the backgrind tape is removed (in action 650) prior to adhering the wafer to the dicing tape (in action 640).

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A method for dicing a wafer comprising:
   scribing perforations in a wafer, wherein the wafer has a monocrystalline structure and the perforations have a polycrystalline structure;
   adhering the wafer to a top surface of a dicing tape; and
   applying a downward force on a periphery of the dicing tape, wherein the downward force causes a bottom surface of the dicing tape to deform around a contour of a dome-shaped chuck, breaking the perforations in the wafer.

2. The method of claim 1, wherein the dicing tape is affixed to a flex frame.

3. The method of claim 1, wherein the scribing is executed by a laser that lases the wafer in two dimensions.

4. The method of claim 1, further comprising returning the dicing tape to the first position after the application of the downward force.

5. The method of claim 1, wherein the flex frame has a circular shape.

6. The method of claim 1, wherein the wafer comprises a plurality of dies for integrated circuit (IC) chips, wherein the plurality of dies are separated by the perforations in the wafer.

7. The method of claim 1, wherein the dicing tape is formed of an elastic material.

8. The method of claim 1, wherein the dome-shaped chuck has a diameter larger than a largest dimension of the wafer and the diameter of the dome-shaped chuck is less than an inner diameter of the flex frame.

9. A method for forming an integrated circuit (IC) chip, the method comprising:
adhering a wafer to dicing tape, the wafer comprising:
a given die forming a discrete circuit; and
a plurality of perforations, wherein the given die is circumscribed by a set of the plurality of perforations of the wafer;
moving the dicing tape attached to a flex frame from a first position to a second position, wherein the dicing tape has a flat surface in the first position;
deforming the dicing tape along a contour of a dome-shaped region of a dome-shaped chuck in the second position, and in the second position, the dome-shaped chuck induces forces transverse to the flat surface of the dicing tape in the first position that cause the plurality of perforations in the wafer to break; and
packaging the given die of the plurality of dies in an IC chip.

10. The method of claim 9, wherein the transverse forces induce non-uniform lateral forces across a thickness of the wafer.

11. The method of claim 9, wherein the wafer has a monocrystalline structure and the plurality of perforations have a polycrystalline structure.

12. The method of claim 9, wherein the plurality of perforations are formed with a lasing process.

13. The method of claim 9, wherein the dome-shaped chuck has a diameter larger than a largest dimension of the wafer and the diameter of the dome-shaped chuck is less than an inner diameter of the flex frame.

14. A method for forming a plurality of integrated circuit (IC) chips, the method comprising:
adhering a wafer comprising perforations between dies of the wafer to a dicing tape, wherein a flex frame is attached to the dicing tape;
moving the dicing tape from a first position to a second position, wherein the dicing tape has a flat surface in the first position;
deforming the dicing tape along a contour of a dome-shaped region of a dome-shaped chuck in the second position, and in the second position, the dome-shaped chuck induces forces transverse to the flat surface of the dicing tape in the first position that cause the perforations in the wafer to break; and
packaging the dies of the wafer in integrated circuit (IC) chips.

15. The method of claim 14, wherein the transverse forces induce non-uniform lateral forces across a thickness of the wafer.

16. The method of claim 14, wherein the breaking of the perforations causes the dies of the wafer to separate.

17. The method of claim 14, wherein the wafer has a monocrystalline structure and the perforations have a polycrystalline structure.

18. The method of claim 14, wherein the perforations are formed with a lasing process.

19. The method of claim 14, wherein the wafer is formed of silicon.

20. The method of claim 14, wherein the dome-shaped chuck has a diameter larger than a largest dimension of the wafer and the diameter of the dome-shaped chuck is less than an inner diameter of the flex frame.

* * * * *